(12) United States Patent
Park et al.

(10) Patent No.: US 8,213,231 B2
(45) Date of Patent: *Jul. 3, 2012

(54) NAND FLASH MEMORY DEVICES HAVING WIRING WITH INTEGRALLY-FORMED CONTACT PADS AND DUMMY LINES AND METHODS OF MANUFACTURING THE SAME

(75) Inventors: Jang-ho Park, Gyeonggi-do (KR);
Jae-kwan Park, Gyeonggi-do (KR);
Dong-hwa Kwak, Gyeonggi-do (KR);
So-wi Jin, Gyeonggi-do (KR);
Byung-jun Hwang, Seoul (KR);
Nam-su Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/987,795

(22) Filed: Jan. 10, 2011

(65) Prior Publication Data

US 2011/0103147 A1 May 5, 2011

Related U.S. Application Data

(63) Continuation of application No. 12/240,529, filed on Sep. 29, 2008, now Pat. No. 7,885,114.

(30) Foreign Application Priority Data

Dec. 17, 2007 (KR) .......................... 10-2007-0132606

(51) Int. Cl.
*G11C 16/04* (2006.01)

(52) U.S. Cl. .................................... 365/185.17; 365/63
(58) Field of Classification Search ............. 365/185.17, 365/63, 185.33; 257/773, 758, 304, 393, 257/E21.681
See application file for complete search history.

(56) References Cited

U.S. PATENT DOCUMENTS

| | | | |
|---|---|---|---|
| 5,581,098 A * | 12/1996 | Chang ........................... | 257/211 |
| 6,331,733 B1 * | 12/2001 | Or-Bach et al. ................ | 257/758 |
| 7,446,352 B2 | 11/2008 | Becker et al. | |
| 7,885,114 B2 | 2/2011 | Park et al. | |
| 2007/0096187 A1 | 5/2007 | Lee | |
| 2007/0200182 A1 | 8/2007 | Liaw | |

FOREIGN PATENT DOCUMENTS

| | | |
|---|---|---|
| JP | 03-270227 | 12/1991 |
| KR | 1020030009572 A | 2/2003 |
| WO | WO 2006/026699 A2 | 3/2006 |

* cited by examiner

*Primary Examiner* — Vu Le
(74) *Attorney, Agent, or Firm* — Myers Bigel Sibley & Sajovec, P.A.

(57) ABSTRACT

A NAND flash memory device includes a plurality of continuous conductors disposed on a common level of a multilayer substrate, the plurality of continuous conductors including respective conductive lines extending in parallel along a first direction, respective contact pads disposed at ends of the respective conductive lines and respective conductive dummy lines extending in parallel from the contact pads along a second direction.

20 Claims, 13 Drawing Sheets

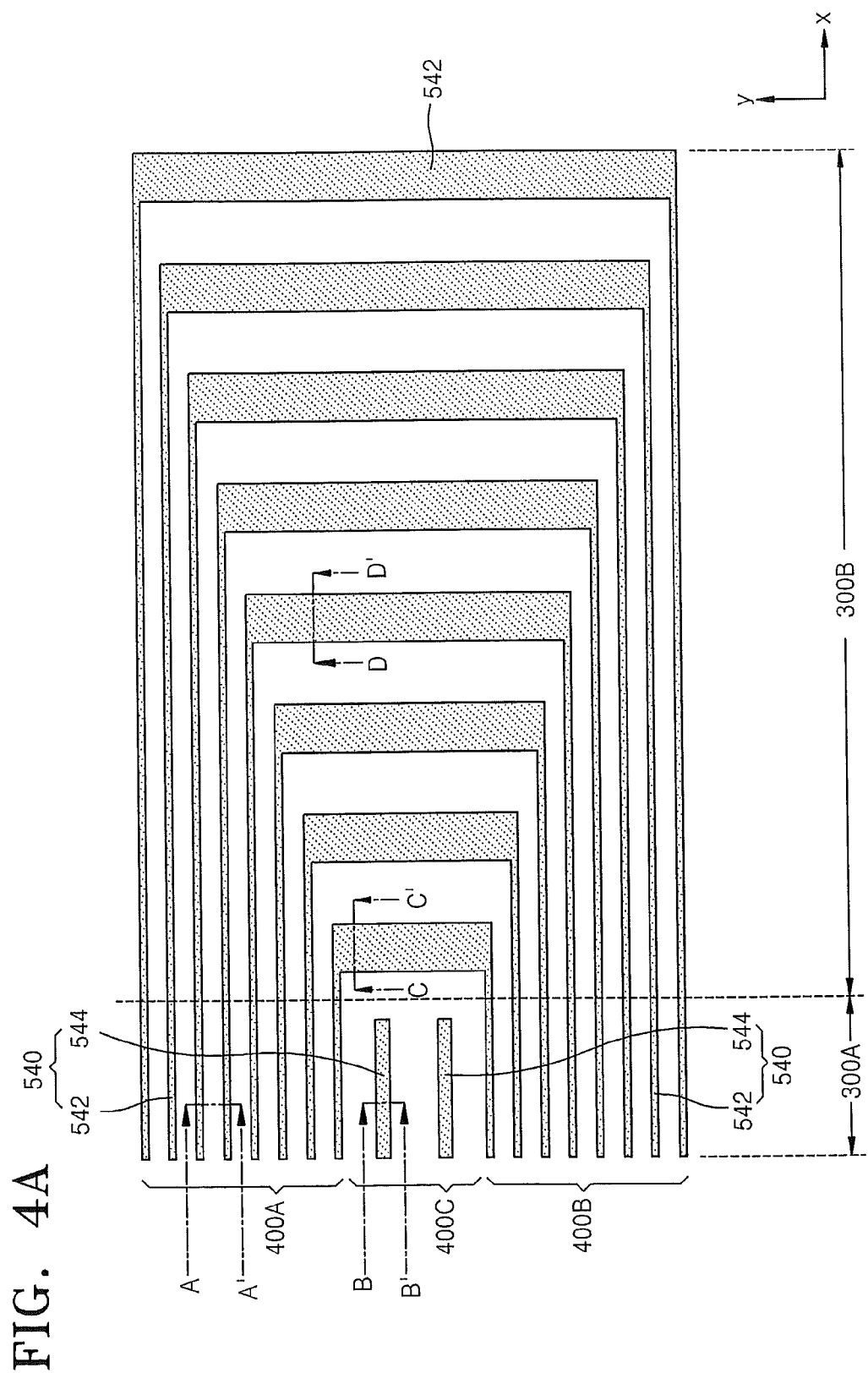

US 8,213,231 B2

NAND FLASH MEMORY DEVICES HAVING WIRING WITH INTEGRALLY-FORMED CONTACT PADS AND DUMMY LINES AND METHODS OF MANUFACTURING THE SAME

CROSS-REFERENCE TO RELATED PATENT APPLICATION

This application is a continuation of U.S. patent application Ser. No. 12/240,529, filed Sep. 29, 2008 now U.S. Pat. No. 7,885,114, which claims the benefit of Korean Patent Application No. 10-2007-0132606, filed on Dec. 17, 2007, in the Korean Intellectual Property Office, the disclosures of which are incorporated herein in their entireties by reference.

FIELD OF THE INVENTION

The present invention relates to semiconductor memory devices and methods of manufacturing the same, and more particularly, to NAND flash memory devices and methods of manufacturing the same.

BACKGROUND OF THE INVENTION

Flash memory devices typically can maintain stored information regardless of power supply and can be classified into devices having a NOR structure and devices having a NAND structure, which are different configurations for connecting memory cells to a bit line and a source line.

FIG. 1 is a block diagram showing a memory cell array 100, along with an X-decoder 110 and a Y-decoder 120, which are peripheral circuits of the memory cell array 100, in a conventional NAND flash memory device. FIG. 2 is a circuit diagram illustrating a structure of the memory cell array 100.

Referring to FIGS. 1 and 2, the NAND flash memory device includes a memory cell array 100 including a plurality of memory cell blocks 100A, each comprising a plurality of memory cells. The X-decoder 110 selects word lines $WL_0$, $WL_1$, through to $WL_{m-1}$, and $WL_m$ of the memory cell blocks 100A and the Y-decoder 120 selects bit lines $BL_0$, $BL_1$, through to $BL_{n-1}$, and $BL_n$ of the memory cell blocks 100A. A Y gating circuit 130 is connected to the Y-decoder 120 to designate a bit line path in the memory cell array 100.

Referring to FIG. 2, the memory cell blocks 100A of the memory cell array 100 include a plurality of cell strings 10 formed between the bit lines $BL_0$, $BL_1$, ..., $BL_{n-1}$, $BL_n$ and a common source line CSL. Each cell string 10 includes a plurality of memory cells 12 connected in series. Gate electrodes of the memory cells 12 included in one cell string 10 are connected to respective word lines $WL_0$, $WL_1$, ..., $WL_{m-1}$, $WL_m$. A ground selection transistor 14 connected to a ground selection line GSL and a string selection transistor 16 connected to a string selection line SSL are connected in series with the memory cells 12 at respective ends of the cell string 10. The ground selection transistor 14 and the string selection transistor 16 control electrical connections between the memory cells 12 and the bit lines $BL_0$, $BL_1$, ..., $BL_{n-1}$, $BL_n$ and the common source line CSL. Memory cells 12 connected to one of the word line $WL_0$, $WL_1$, ..., $WL_{m-1}$, $WL_m$ across the cell strings 10 form a page unit or a byte unit.

In the NAND flash memory device of FIGS. 1 and 2, in order to perform a read operation or a write operation, a memory cell is read by selecting one of the word lines $WL_0$, $WL_1$, ..., $WL_{m-1}$, $WL_m$ and one of the bit lines $BL_0$, $BL_1$, ..., $BL_{n-1}$, $BL_n$ using the X-decoder 110 and the Y-decoder 120, respectively.

Typically, a NAND flash memory device has a relatively high integration density. However, further reduction of the design rule of NAND flash memory devices is desired to further reduce chip size. As the design rule is reduced, minimum pitch of patterns required for constituting the NAND flash memory device may be greatly reduced.

In order to realize a minute pattern that meets the reduced design rule, various methods of forming patterns may be employed. For example, in order to realize a cell array structure of NAND flash memory device that is difficult to realize using current photolithography techniques, a double patterning technique for forming repeated patterns with a pitch less than the limits of conventional lithography techniques has been developed. When a NAND flash memory device is manufactured using such a double patterning technique, for example, when the word lines $WL_0$, $WL_1$, ..., $WL_{m-1}$, $WL_m$ are formed, the ground selection line GSL and the string selection line SSL may be simultaneously formed.

In a conventional NAND flash memory device, a contact pad for connecting the word lines $WL_0$, $WL_1$, ..., $WL_{m-1}$, $WL_m$ to the X-decoder 110 may be integrally formed with the word lines $WL_0$, $WL_1$, ..., $WL_{m-1}$, $WL_m$. The contact pad connected to the word lines $WL_0$, $WL_1$, ..., $WL_{m-1}$, $WL_m$ may be simultaneously formed with the word lines $WL_0$, $WL_1$, ..., $WL_{m-1}$, $WL_m$. Thus, when the word lines $WL_0$, $WL_1$, ..., $WL_{m-1}$, $WL_m$ are formed using the double patterning technique, a trimming process for removing undesired portions of minute patterns formed around the contact pad for connecting to the peripheral circuit may also need to be performed. The same trimming process may also be applied when a contact pad for connecting the bit lines $BL_0$, $BL_1$, ..., $BL_{n-1}$, $BL_n$ to the Y-decoder 120 is integrally formed with the bit lines $BL_0$, $BL_1$, ..., $BL_{n-1}$, $BL_n$.

However, in some conventional NAND flash memory devices, the structure of contact pads connected to word lines and bit lines is minute and complicated, and thus, a layout of a mask pattern for the trimming process may be complicated. In particular, design rules for NAND flash memory devices have been greatly reduced according to recent market demand, and the pattern sizes of word lines and bit lines in NAND flash memory devices are generally becoming more minute. Accordingly, the structure of the contact pads for connecting peripheral circuits and the word lines and the bit lines have generally become even more minute and complicated. Therefore, the layout of a mask pattern for that trimming process may also be minute and complicated.

Also, because the pitch between the minute patterns formed by the double patterning technique may be very small, when a mask pattern for trimming is formed, a tolerance of an alignment error between the minute patterns formed using the double patterning technique and the mask pattern may need to be very strict. Thus, due to a possibility of misalignment occurring during performance of an aligning process and variations in the etching process, patterns may be unintentionally removed or an undesired pattern can be obtained when the trimming process is performed.

SUMMARY OF THE INVENTION

In some embodiments of the present invention, a NAND flash memory device includes a plurality of continuous conductors disposed on a common level of a multilayer substrate, the plurality of continuous conductors including respective conductive lines extending in parallel along a first direction, respective contact pads disposed at ends of the respective conductive lines and respective conductive dummy lines extending in parallel from the contact pads along a second direction.

The first direction may be perpendicular to the second direction. The contact pads may include respective rectangular contact pads disposed at respective junctions of the conductive lines and the conductive dummy lines. In some embodiments, the conductive lines and conductive dummy lines define right angles, and the contact pads include rectangular regions that alternately protrude inside and outside of the right angles along the first direction.

In further embodiments, the contact pads are arranged in pairs including adjacent contact pads that protrude toward one another along the first direction. The lengths of the conductive dummy lines may monotonically vary along the first direction.

The conductive lines may be word lines or bit lines. The conductive lines may include word lines, each including a tunneling oxide film, a charge storage layer, a blocking oxide film, and a gate electrode layer. The conductive lines, the contact pads, and the conductive dummy lines may be formed of the same material.

In additional embodiments of the present invention, a NAND flash memory device includes a first plurality of continuous conductors disposed on a common level of a multilayer substrate, the plurality of first continuous conductors including respective first conductive lines extending in parallel along a first direction, respective first contact pads disposed at ends of the respective first conductive lines and respective first conductive dummy lines extending in parallel from the first contact pads along a second direction. The memory device further includes a second plurality of continuous conductors disposed adjacent the first plurality of continuous conductors on the common level of the multilayer substrate, the plurality of second continuous conductors including respective second conductive lines extending in parallel along the first direction, respective second contact pads disposed at ends of the respective second conductive lines and respective second conductive dummy lines extending in parallel from the second contact pads along the second direction. The second plurality of continuous conductors is a mirror image of the first plurality of continuous conductors about an axis of symmetry therebetween.

The first conductive dummy lines may have differing lengths and/or the second conductive dummy lines have differing lengths.

The semiconductor substrate may include a memory cell region in which a plurality of memory cells are formed by the first conductive lines and the second conductive lines and a connection region in which the first contact pads and the second contact pads are formed. The first conductive dummy lines and the second conductive dummy lines may extend across the memory cell region and the connection region. The first conductive lines and the second conductive lines may be formed only in the connection region and have lengths gradually increasing with distance from the memory cell region.

The first conductive lines and the second conductive lines may be word lines. The device may further include string selection lines extending parallel to the first conductive lines and the second conductive lines between the first and second conductive lines. In some embodiments, the first conductive lines and the second conductive lines may be bit lines.

Further embodiments of the present invention provide methods of manufacturing NAND flash memory devices. A conductive layer is formed on a semiconductor substrate. A plurality of first mask patterns is formed on the substrate, the first mask patterns including first linear portions extending in parallel along a first direction and second linear portions extending in parallel from respective ends of the first linear portions along a second direction. Sidewall spacers are formed on sidewalls of the mask patterns. Second mask patterns are formed covering portions of the first mask patterns and the sidewall spacers proximate corners at which the first linear portions and the second linear portions of the first mask patterns meet. The first mask patterns are etched using the second mask patterns as an etching mask to remove portions of the first mask patterns not covered by the second mask patterns and to leave the sidewall spacers and portions of the first mask patterns underlying the second mask patterns. The conductive layer is etched using the sidewall spacers and the remaining portions of the first mask patterns as etching masks to form a plurality of continuous conductors including respective conductive lines extending in parallel along the first direction, respective contact pads disposed at ends of the respective conductive lines and respective conductive dummy lines extending in parallel from the contact pads along the second direction. The first direction may be perpendicular to the second direction.

In further embodiments, the first mask patterns include U-shaped masked patterns including the first linear portions, the second linear portions and third linear portions extending in parallel from ends of the second linear portions along the first direction, parallel to the first linear portions. Forming second mask patterns may include forming second mask portions covering portions of the first mask patterns and the sidewall spacers proximate corners at which the second and third linear portions of the first mask patterns meet. Etching the first mask patterns using the second mask patterns as an etching mask may include etching the first mask pattern to leave U-shaped sidewall spacers having first linear spacer portions extending in parallel along the first direction, second linear spacer portions extending in parallel from ends of the first linear spacer portions along the second direction and third linear spacer portions extending in parallel from ends of the second linear spacer portions along the first direction, parallel to the first linear spacer portions. Etching the conductive layer using the sidewall spacers and the remaining portions of the first mask patterns as etching masks may be preceded by removing central portions of the second linear spacer portions midway between the first and third linear spacer portions, and etching the conductive layer using the sidewall spacers and the remaining portions of the first mask patterns as etching masks may include etching the conductive layer to form a first plurality of continuous conductors including respective first conductive lines extending in parallel along a first direction, respective first contact pads disposed at ends of the respective first conductive lines and respective first conductive dummy lines extending in parallel from the first contact pads along a second direction and a second plurality of continuous conductors disposed adjacent the first plurality of continuous conductors and including respective second conductive lines extending in parallel along the first direction, respective second contact pads disposed at ends of the respective second conductive lines and respective second conductive dummy lines extending in parallel from the second contact pads along the second direction. The second plurality of continuous conductors may be a mirror image of the first plurality of continuous conductors about an axis of symmetry therebetween.

Removing central portions of the second linear spacer portions midway between the first and third linear spacer portions may include removing the second mask patterns to expose the underlying remaining portions of the first mask patterns, forming a separation mask pattern on the substrate, covering the sidewall spacers and the exposed remaining portions of the first mask patterns and exposing the central portions of the second linear spacer portions midway between the first and third linear spacer portions and etching using the separation mask pattern as an etching mask to remove the central portions of the second linear spacer portions midway between the first and third linear spacer portions.

The methods may further include forming parallel linear third mask patterns between the first and third linear portions of the first mask patterns, forming sidewall spacers on the third mask patterns and etching the conductive layer using the third mask patterns and the sidewall spacers thereon as etching masks to form string select lines between the first and second conductive lines.

To address the above and/or other problems, some embodiments of the present invention provide NAND flash memory devices having a structure in which a trimming process for removing unnecessary portions can be effectively performed using a simple process when conductive lines that constitute a memory cell array region and contact pads for connecting the conductive lines to peripheral circuits are integrally formed so as to connect to each other.

The present invention also provides method of manufacturing NAND flash memory devices having a structure in which a trimming process for removing unnecessary portions can be effectively performed using a simple process when conductive lines that constitute a memory cell array region and contact pads for connecting the conductive lines to peripheral circuits are integrally formed so as to connect to each other even if the NAND flash memory device that is designed according to a reduced design rule is manufactured.

According to some embodiments of the present invention, there is provided a NAND flash memory device including: a plurality of conductive lines extending parallel to each other in a first direction on a semiconductor substrate; a plurality of contact pads integrally formed with the conductive lines at an end of each of the conductive lines in order to connect the conductive lines to external circuits; and a plurality of conductive dummy lines that extend in a second direction different from the first direction from the contact pads and respectively have different lengths from each other.

The conductive dummy lines may have respective lengths sequentially increasing in the first direction.

The conductive dummy lines may extend in the second direction from the contact pads to a line extending in the first direction.

The first direction and the second direction may be perpendicular to each other.

The conductive dummy lines may constitute conductive dummy line pairs by pairing two adjacent conductive dummy lines, and the contact pads may be formed to extend only in a region defined by the two conductive dummy lines that constitute the dummy conductive pair.

The conductive lines may be word lines or bit lines. The external circuits may be decoders.

According to another aspect of the present invention, there is provided a NAND flash memory device including: a first conductive line block including a plurality of first conductive lines extending parallel to each other in a first direction on a semiconductor substrate; a plurality of first contact pads integrally formed with the first conductive lines at an end of each of the first conductive lines, respectively, in order to connect the first conductive lines to external circuits; a second conductive line block including a plurality of second conductive lines extending parallel to each other in the first direction on the semiconductor substrate and neighbouring the first conductive line block; a plurality of second contact pads integrally formed with the second conductive lines at an end of each of the second conductive lines, respectively, in order to connect the second conductive lines to external circuits; a plurality of first conductive dummy lines extending towards the second contact pads along a second direction which is perpendicular to the first direction from the first contact pads; and a plurality of second conductive dummy lines that extend from the second contact pads towards the first contact pads in the second direction, wherein, in a portion of a region between the first conductive line block and the second conductive line block, a length of each of the first and second conductive dummy lines facing each other, which are selected from first and second conductive dummy line pairs, is greater than a distance between the first and second conductive lines of the selected first and second conductive dummy line pair.

One selected from the first conductive dummy lines and the second conductive dummy lines or both of them may have different lengths from each other.

The semiconductor substrate may include a memory cell region in which a plurality of memory cells are formed by the first conductive lines and the second conductive lines and a connection region in which the first contact pads and the second contact pads are formed, the first conductive lines and the second conductive lines may extend across the memory cell region and the connection region, and the first conductive dummy lines and the second conductive dummy lines may be only formed in the connection region and have lengths gradually increasing the farther away from the memory cell region the conductive dummy lines are. The first conductive dummy lines may have different lengths from each other, the second conductive dummy lines may have different lengths from each other, and a first conductive dummy line selected from the first conductive dummy lines may have the same length as a second conductive dummy line that faces the first conductive dummy line.

The NAND flash memory device may further include string selection lines extending parallel to the first conductive lines and the second conductive lines between the first conductive line block and the second conductive line block.

According to some embodiments of the present invention, there is provided a method of manufacturing a NAND flash memory device, the method including: forming a conductive layer on a semiconductor substrate having a memory cell region that includes a first memory cell block region and a second memory cell block region and a connection region for connecting conductive lines of the memory cell region to external circuits; forming mask patterns having a plurality of first mask lines that extend from the first memory cell block region to the second memory cell block region through the connection region on the conductive layer; separating the first mask lines into a plurality of first region mask patterns extending from the connection region to the first memory cell block region and a plurality of second region mask patterns extending from the connection region to the second memory cell block region by removing a portion of the first mask lines in the connection region; and forming a plurality of first conductive lines extending parallel to each other in the first memory cell block region and the second memory cell block region of the memory cell region, a plurality of contact pads integrally formed with the first conductive lines in the connection region, respectively, and a plurality of conductive dummy lines extending from the contact pads in the connection region by etching the conductive layer using the mask patterns that include the first region mask patterns and the second region mask patterns as etch masks.

The first mask lines may extend in a first direction in the first memory cell block region and the second memory cell block region, and may extend in a second direction, which is perpendicular to the first direction in the connection region.

The first mask lines may include a plurality of line patterns extending from the first memory cell block region to the second memory cell block region through the connection region and a plurality of contact mask patterns connected to the line patterns in the connection region, respectively.

The forming of the mask patterns may include: forming mold mask patterns extending from the first memory cell block region to the second memory cell block region through the connection region on the conductive layer; forming a plurality of spacers covering sidewalls of the mold mask patterns over an area extending from the first memory cell block region to the second memory cell block region through the connection region; forming a local mask pattern that covers a first local region selected from the mold mask patterns and a portion of the spacers adjacent to the first local region in the connection region; and forming the first mask lines including the first local region and the spacers by etching the mold mask patterns using the spacers and the local mask patterns as etch masks.

The separating of the first mask lines into the first region mask patterns and the second region mask patterns may includes: forming a separation mask pattern having an opening that exposes a portion of the first mask line on the first mask lines; and removing the first mask lines exposed through the opening.

The opening may have a slit shape having a lengthwise axis that extends in a direction different from the extension direction of the first mask lines in the connection region.

The mask patterns may further include second mask lines extending parallel to the first mask lines between the first memory cell block region and the second memory cell block region of the memory cell region.

In this case, the forming of the mask patterns may include: forming first mold mask patterns extending from the first memory cell block region to the second memory cell block region through the connection region and forming second mold mask patterns extending parallel to the first mold mask patterns between the first memory cell block region and the second memory cell block region on the conductive layer; forming a plurality of first spacers covering sidewalls of the first mold mask patterns over an area extending from the first memory cell block region to the second memory cell block region through the connection region and forming a plurality of second spacers covering sidewalls of the second mold mask patterns in the memory cell region; forming a first local mask pattern that covers a first local region selected from the first mold mask patterns and a portion of the spacers adjacent to the first local region in the connection region and forming a second local mask pattern that covers the second mold mask patterns and the second spacers in the memory cell region; and forming the first mask lines including the first local regions and the first spacers by etching the first mold mask patterns using the first spacers, the first local mask pattern, and the second local mask pattern as etch masks and forming the second mask lines including the second mold mask patterns and the second spacers.

The separating of the first mask lines into the first region mask patterns and the second region mask patterns may include: forming a separation mask pattern having an opening that exposes a portion of the first mask line on the first mask lines second mask lines; and removing the first mask lines exposed through the opening.

The first region mask patterns, the second region mask patterns, and the second mask lines may be used as etch masks in order to etch the conductive lines. The method may further include second conductive lines extending parallel to the first conductive lines between the first memory cell block region and the second memory cell block region in the memory cell region by etching the conductive lines. The first conductive lines may word lines formed in the memory cell region, and the second conductive lines may be string selection lines formed in the memory cell region.

BRIEF DESCRIPTION OF THE DRAWINGS

The above and other features and advantages of the present invention will become more apparent by describing in detail exemplary embodiments thereof with reference to the attached drawings in which:

FIGS. 4A-4F are plan views of a layout of a portion of the NAND flash memory device 300 illustrating operations for manufacturing a NAND flash memory device according to some embodiments of the present invention.

DETAILED DESCRIPTION OF EMBODIMENTS OF THE INVENTION

Figure 1:
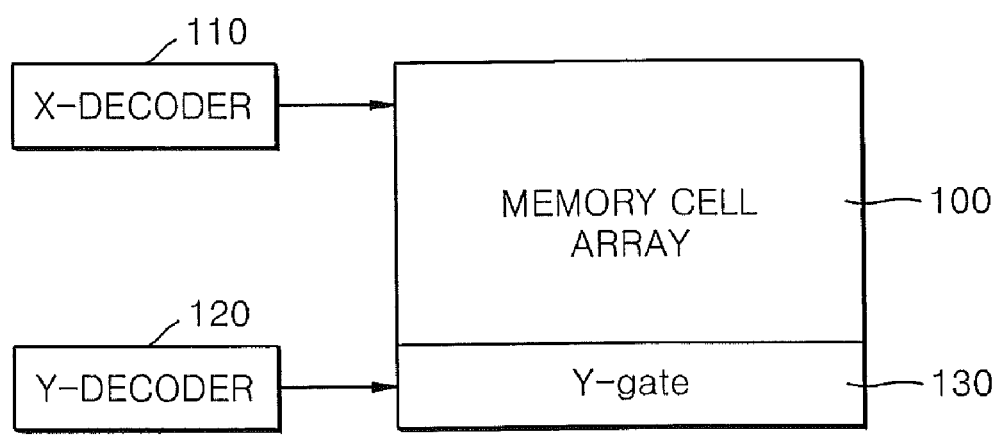
FIG. 1 is a block diagram showing a memory cell array and peripheral circuits of a conventional NAND flash memory device.
Figure 2:
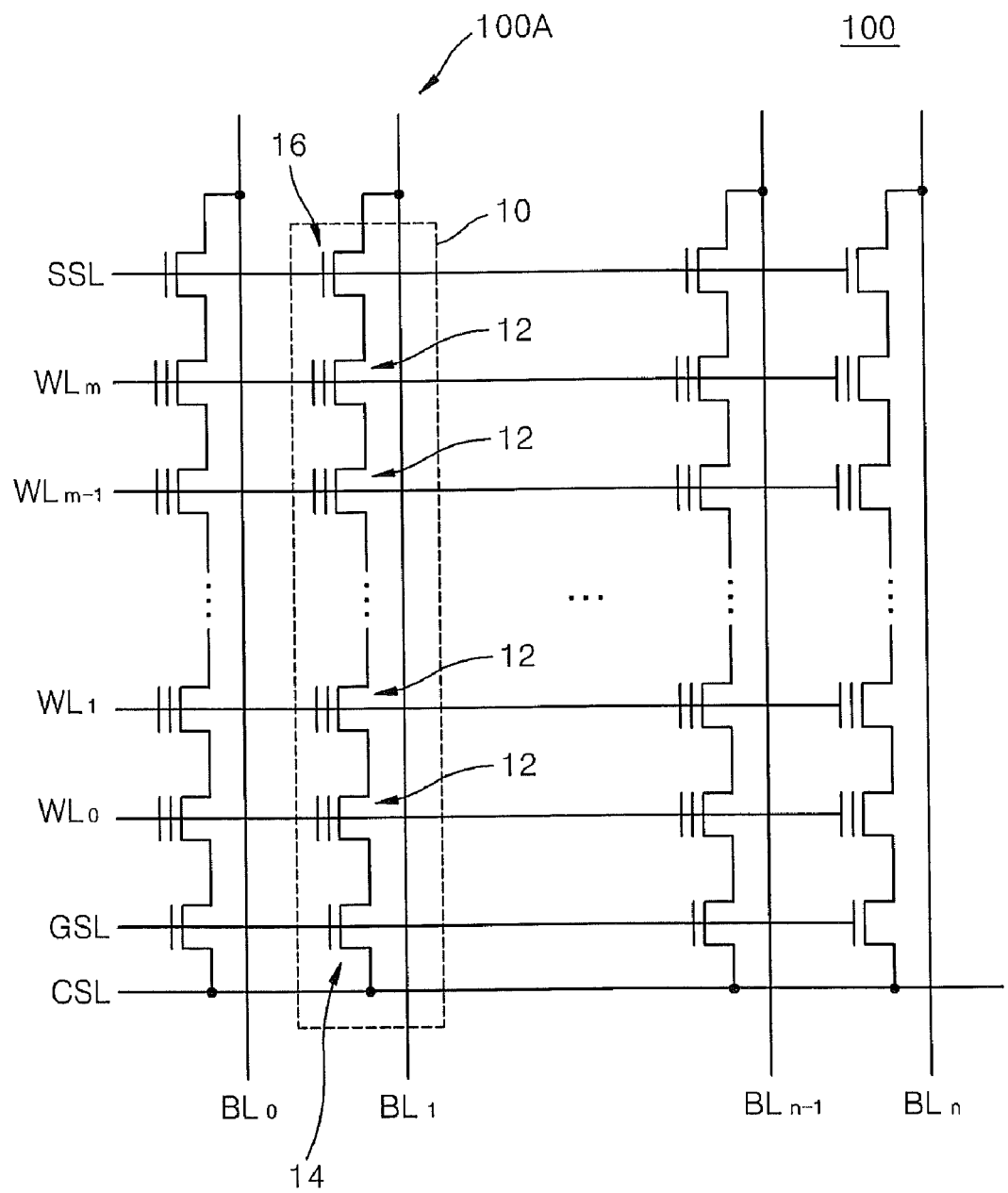
FIG. 2 is a circuit diagram illustrating a memory cell array structure of a conventional NAND flash memory device.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Figure 3:
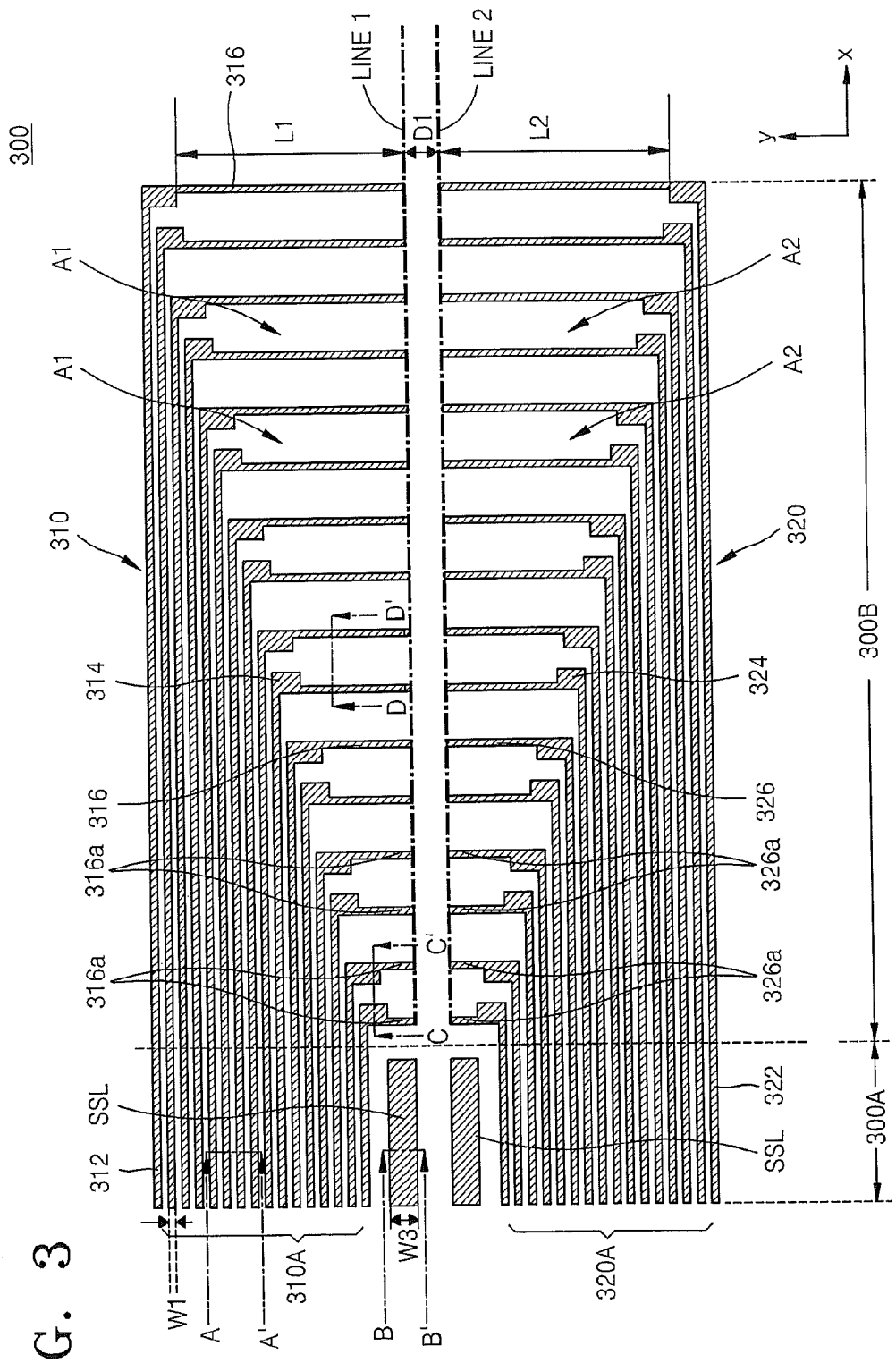
FIG. 3 is a plan view of a configuration of a NAND flash memory device according to some embodiments of the present invention.

FIG. 3 is a plan view of a configuration of a NAND flash memory device 300 according to some embodiments of the present invention. The flash memory device 300 includes a memory cell region 300A and a connection region 300B for connecting a plurality of conductive lines, for example, word lines and bit lines that constitute a cell array of the memory cell region 300A, to external circuits, such as decoders (not shown).

The NAND flash memory device 300 includes a first conductive line block 310 and an adjacent second conductive line block 320. The first conductive line block 310 includes a plurality of first conductive lines 312 that extend in parallel along a first direction (an x direction in FIG. 3). The second conductive line block 320 includes a plurality of second conductive lines 322 that extend in parallel in the first direction.

The first conductive line block 310 and the second conductive line block 320 extend across the memory cell region 300A and the connection region 300B. A portion of the first conductive line block 310 that is formed in the memory cell region 300A is a first memory cell block 310A. A portion of the second conductive line block 320 that is formed in the memory cell region 300A is a second memory cell block 320A.

In order to connect each of the first conductive lines 312 of the first conductive line block 310 to external circuits, such as decoders, a plurality of first contact pads 314 are integrally formed with the first conductive lines 312 at ends of the first conductive lines 312. In order to connect each of the second conductive lines 322 of the second conductive line block 320 to external circuits, such as decoders, a plurality of second contact pads 324 are integrally formed with the second conductive lines 322 at ends of the second conductive lines 322.

In the connection region 300B, a plurality of first conductive dummy lines 316 extend from the first contact pads 314 in a direction transverse to the direction in which the first conductive lines 312 extend. A plurality of second conductive dummy lines 326 extend from the second contact pads 324 in a direction different from the direction in which the second conductive lines 322 extend. In FIG. 3, it is depicted that the first conductive dummy lines 316 extend from the first contact pads 314 in a second direction (a y direction in FIG. 3) perpendicular to the direction of the first conductive lines 312. Also, in FIG. 3, it is depicted that the second conductive dummy lines 326 extend from the second contact pads 324 in the second direction perpendicular to the direction of the second conductive lines 322. However, the present invention is not limited thereto, and the configurations of the first conductive dummy lines 316 and the second conductive dummy lines 326 may be modified in various ways without departing from the scope of the present invention.

In the connection region 300B of the NAND flash memory device 300 of FIG. 3, the first conductive dummy lines 316 and the second conductive dummy lines 326 face each other between the first conductive line block 310 and the second conductive line block 320. In a portion of the connection region 300B, lengths L1 and L2 of a first conductive dummy line 316 and opposing second conductive dummy line 326 are greater than a distance D1 therebetween (L1>D1, L2>D1). The lengths L1 and L2 of the opposing first conductive dummy line 316 and second conductive dummy line 326 may or may not be equal.

In FIG. 3, the first conductive dummy lines 316 extend in the second direction to a boundary LINE1 from the first contact pads 314. The second conductive dummy lines 326 extend in the second direction to a second boundary LINE2 from the second contact pads 324. The directions of the first and second boundaries LINE1 and LINE2 are not limited to the directions indicated in FIG. 3, and may be modified in various directions within the scope of the embodiment of the present invention.

In the NAND flash memory device 300 of FIG. 3, the first conductive dummy lines 316 have different lengths and the second conductive dummy lines 326 have different lengths. However, the present invention is not limited thereto. For example, the first conductive dummy lines 316 may have the same lengths and the second conductive dummy lines 326 may have different lengths. In some embodiments, the first conductive dummy lines 316 may have different lengths and the second conductive dummy lines 326 may have the same lengths.

In the NAND flash memory device 300 of FIG. 3, the first conductive dummy lines 316 and the second conductive dummy lines 326 have respectively longer lengths moving away from the memory cell region 300A.

In the NAND flash memory device 300 of FIG. 3, the first conductive dummy lines 316 are arranged as first conductive dummy line pairs 316a, each pair comprising two immediately adjacent first conductive dummy lines 316. The first contact pads 314 extend into regions A1 defined by the first conductive dummy lines 316 of the first conductive dummy line pairs 316a. The second conductive dummy lines 326 have a plurality of second conductive dummy line pairs 326a, each pair comprising two immediately adjacent second conductive dummy lines 326. The second contact pads 324 extend into regions A2 defined by the two second conductive dummy lines 326 of the second conductive dummy line pairs 326a.

The first conductive lines 312, the second conductive lines 322, the first contact pads 314, the second contact pads 324, the first conductive dummy lines 316, and the second conductive dummy lines 326 may be formed of the same material.

In some embodiments, the first conductive lines 312 and the second conductive lines 322 may be respective word lines connected to memory cells in the memory cell region 300A. In this case, as depicted in FIG. 3, respective string selection lines SSL extending parallel to the first conductive lines 312 and the second conductive lines 322 may be formed between the first conductive line block 310 and the second conductive line block 320. The string selection lines SSL may have a width W3 which is greater than widths W1 and W2 of the first conductive lines 312 and the second conductive lines 322, and may be formed of the same material used to form the first conductive lines 312 and the second conductive lines 322. In some embodiments, the first conductive lines 312 and the second conductive lines 322 may be respective bit lines connected to memory cells in the memory cell region 300A. In this case, the string selection lines SSL may be omitted.

A method of manufacturing the NAND flash memory device 300 of FIG. 3 according to some embodiments of the present invention will now be described.

FIGS. 4A-4F are plan views of a layout of a main portion of the NAND flash memory device 300 illustrating operations for manufacturing the NAND flash memory device 300 according to some embodiments of the present invention. FIGS. 5A-5G are cross-sectional views taken along corresponding lines A-A', B-B', C-C', and D-D' of FIG. 3 illustrating operations for manufacturing the NAND flash memory device 300 according to some embodiments of the present invention. In FIGS. 4A-4F, cross-sections of A-A', B-B', C-C' and D-D' corresponding to the cross-sections of A-A', B-B', C-C' and D-D' of FIG. 3 are indicated. In FIGS. 4A through 4F and in FIGS. 5A through 5G, like reference numerals are used to indicate items corresponding to those shown in FIG. 3, and thus, the description thereof will not be repeated.

Figure 4B:
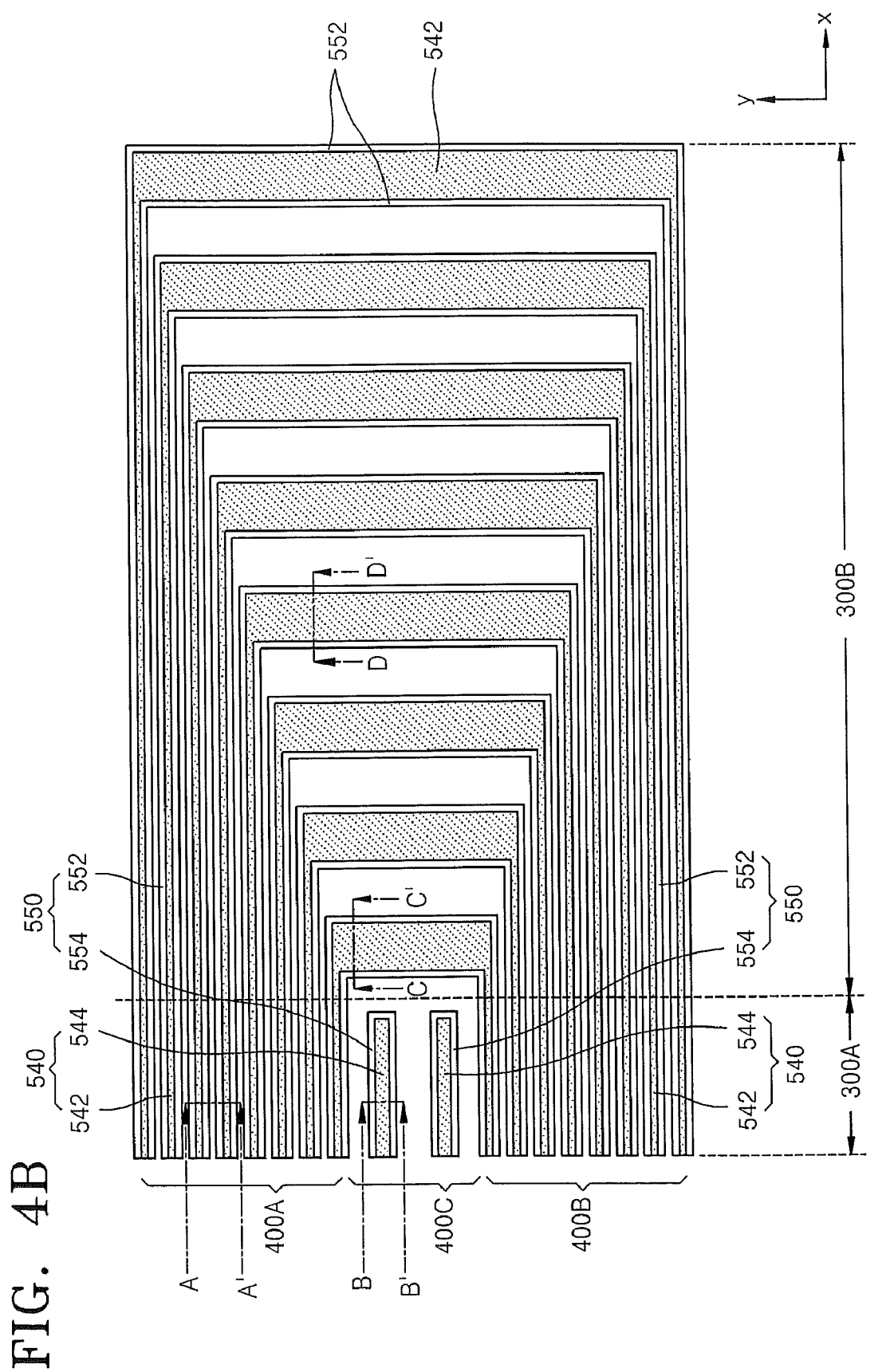
Figure 5A:
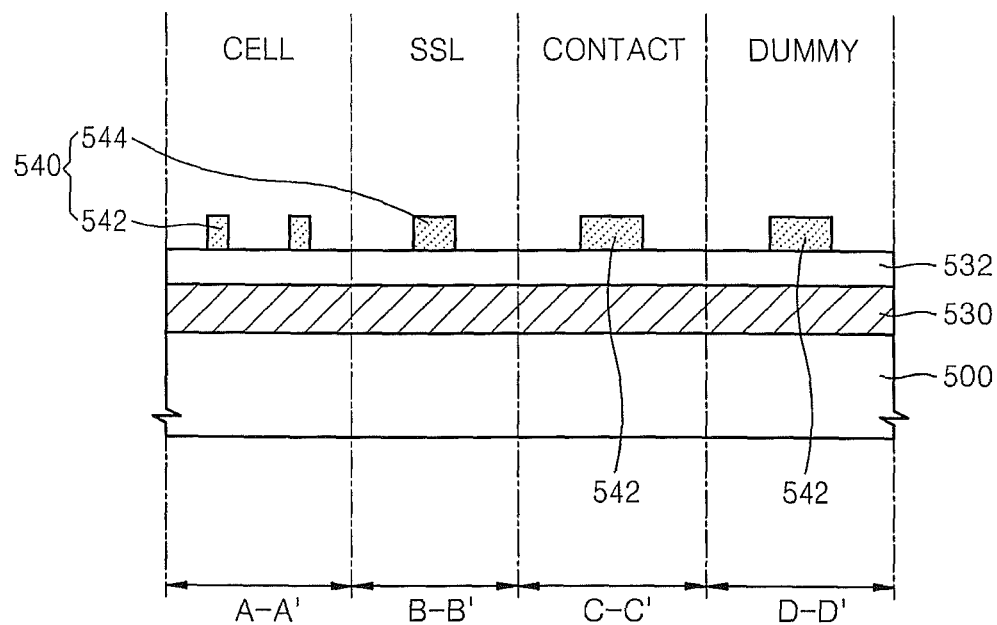
FIGS. 5A through 5G are cross-sectional views corresponding to lines A-A', B-B', C-C', and D-D' of FIG. 3 illustrating operations for manufacturing a NAND flash memory device according to some embodiments of the present invention.

Referring to FIGS. 4A and 5A, a semiconductor substrate 500 has memory cell region 300A defined thereon. The memory cells region 300A includes a first memory cell block region 400A, a second memory cell block region 400B, a string selection region 400C between the first and second memory cell block regions 400A and 400B and a connection region 300B for connecting conductive lines to be formed in the memory cell region 300A to external circuits (not shown).

A conductive layer 530 and a capping layer 532 for forming the conduction lines are sequentially formed on the semiconductor substrate 500. If word lines are formed from the conductive layer 530, the conductive layer 530 may have a stack structure in which a tunnelling oxide film, a charge storage layer, a blocking oxide film, and a gate electrode layer are sequentially stacked on the semiconductor substrate 500. In this case, the tunnelling film may be formed of a silicon oxide film. The charge storage layer may be formed, for example, of a silicon nitride film or a high-k film having a dielectric constant higher than that of the silicon nitride film. For example, the charge storage layer may be formed of a $Si_3N_4$ film, a metal oxide film, a metal nitride film, or a combination of these films. The blocking oxide film may be formed of at least one material selected from the group consisting of $Al_2O_3$, $SiO_2$, $HfO_2$, $ZrO_2$, LaO, LaAlO, LaHfO, and HfAlO. The gate electrode layer may be formed of a material selected from the group consisting of TaN, TiN, W, WN, HfN, tungsten silicide, or a combination of these materials. In other embodiments, the conductive layer 530 may have a stack structure in which a tunnelling film, a floating gate conductive layer, an intergate dielectric film, and a control gate conductive layer are sequentially stacked on the semiconductor substrate 500 and the capping layer 532 may be formed of a silicon nitride film. In some embodiments, the capping layer 532 may be omitted. If bit lines are formed from the conductive layer 530, the conductive layer 530 may be formed, for example, of doped silicon or a metal layer.

A plurality of mold mask patterns 540 is formed on the capping layer 532. The mold mask patterns 540 include a plurality of first mold mask patterns 542 that extend from the first memory cell block region 400A to the second memory cell block region 400B through the connection region 300B. The first mold mask patterns 542 include portions that extend in a first direction (an x direction in FIG. 4A) in the first and second memory cell block regions 400A and 400B, portions that extend in the first direction in the connection region 300B, and portions that extend in a second direction (a y direction in FIG. 4A) perpendicular to the first direction in the connection region 300B. The mold mask patterns 540 further include second mold mask patterns 544 that extend in the first direction parallel to the first mold mask patterns 542 between the first and second memory cell block regions 400A and 400B. The mold mask patterns 540 may be formed of, for example, a polysilicon film or a nitride film.

Figure 5B:
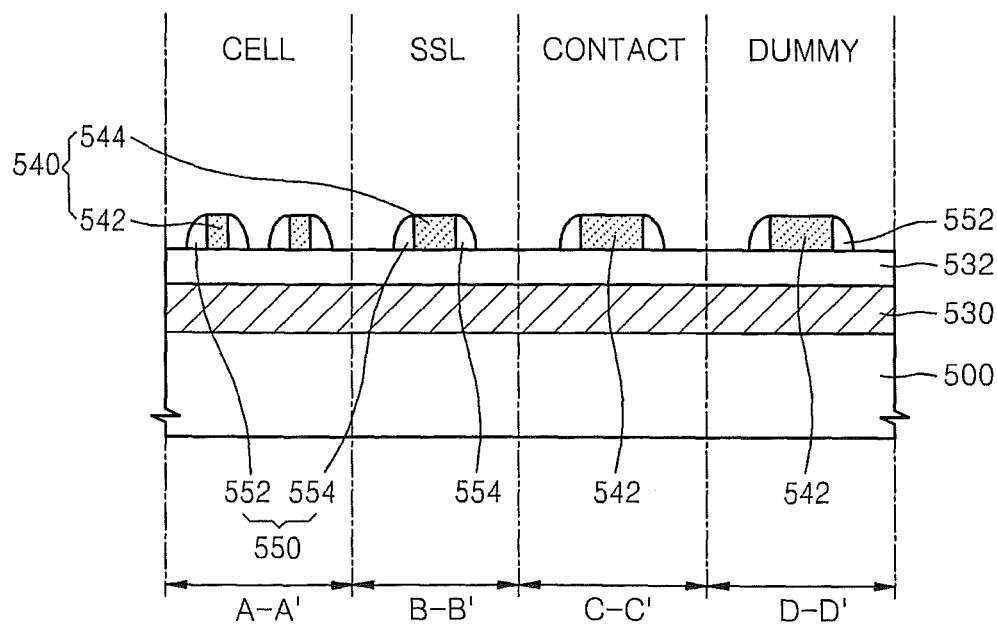

Referring to FIGS. 4B and 5B, spacers 550 are formed on sidewalls of the mold mask patterns 540. The spacers 550 include a plurality of first spacers 552 covering the first mold mask patterns 542 over an area extending from the first memory cell block region 400A to the second memory cell block regions 400B through the connection region 300B. The spacers 550 further include a plurality of second spacers 554 covering sidewalls of the second mold mask patterns 544 in the memory cell region 300A.

To form the spacers 550, a material for forming the spacers 550 that cover a top surface and sidewalls of the mold mask patterns 540 may be deposited on the substrate 500 and the mold mask patterns 540. Subsequently, an etch back process may be performed to etch back the material to form the spacers 550. The spacers 550 may be formed, for example, from a film selected from the group consisting of an atomic layer deposition (ALD) oxide film, a chemical vapor deposition (CVD) oxide film, an undoped silicate glass film (USG), and a high density plasma (HDP) oxide film.

Figure 4C:
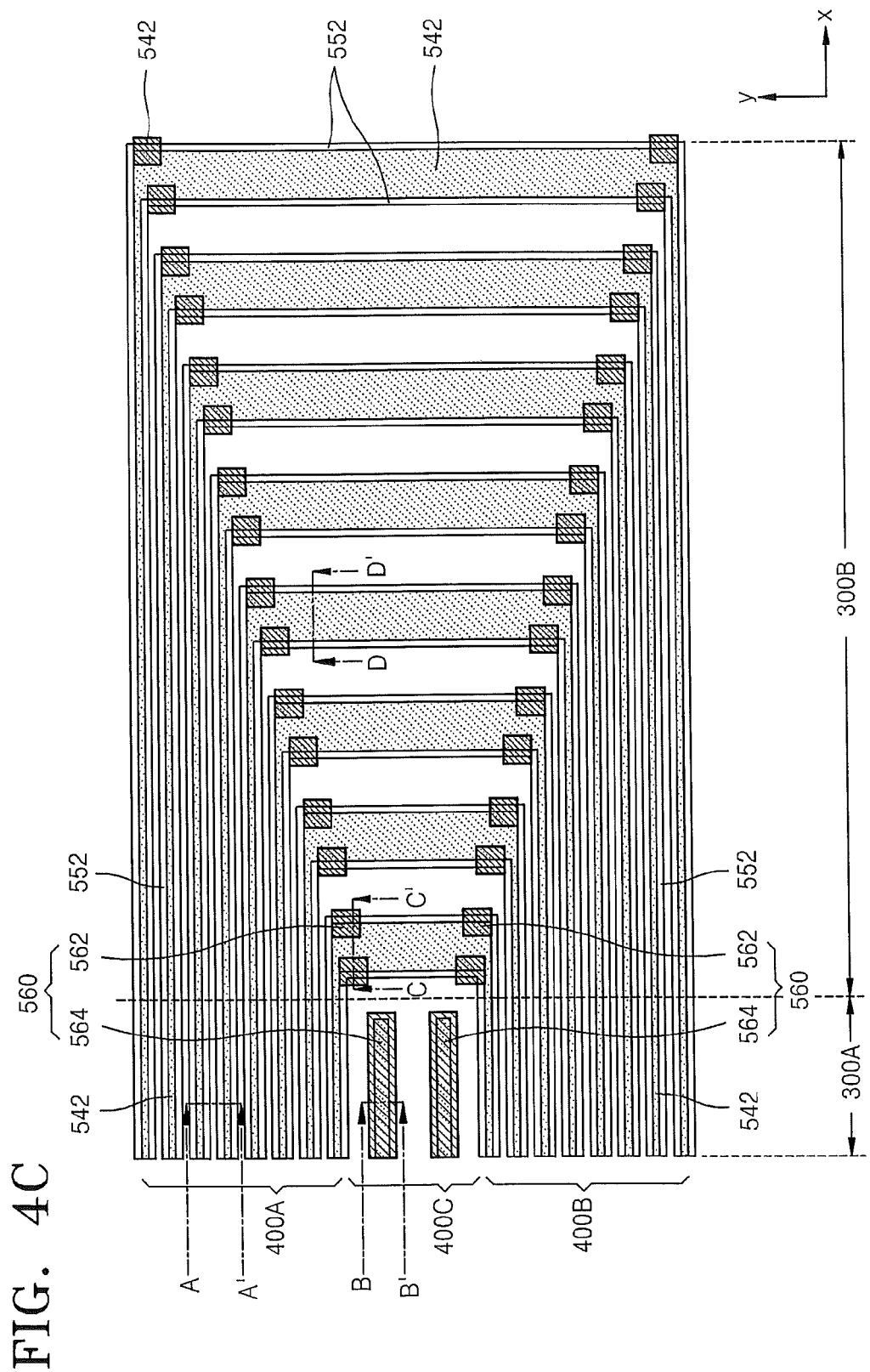
Figure 5C:
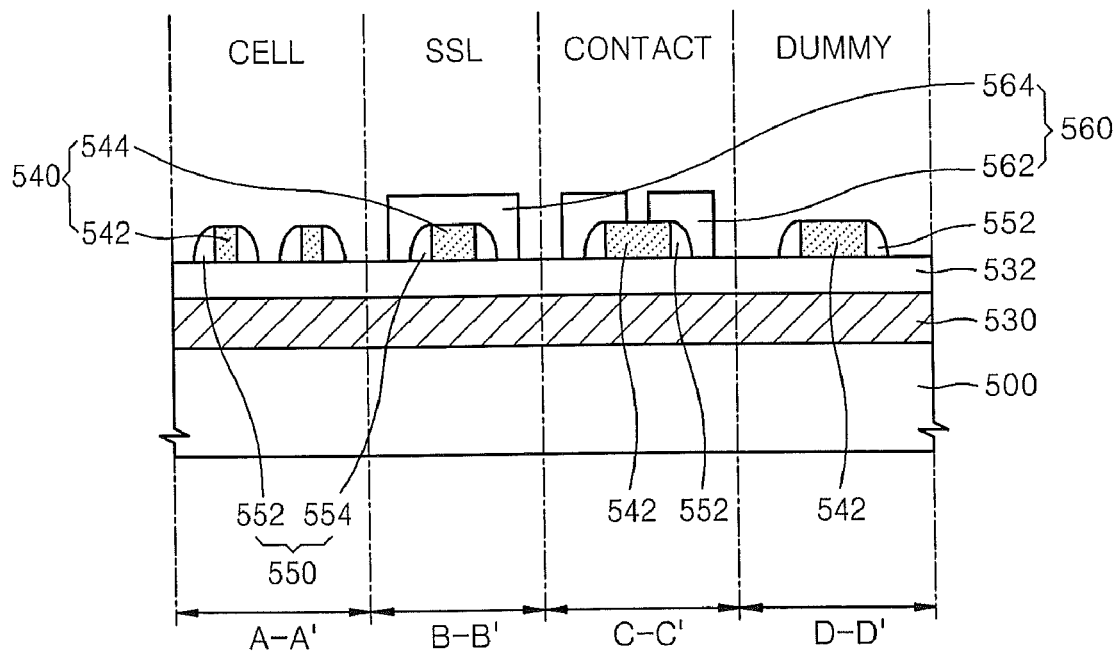

Referring to FIGS. 4C and 5C, local mask patterns 560 are formed, covering portions of the mold mask patterns 540 and portions of the spacers 550. The local mask patterns 560 include first local mask patterns 562 that cover first local regions selected from the first mold mask patterns 542 in the connection region 300B and portions of the spacers 550 adjacent to the first local regions. The local mask patterns 560 further includes second local mask patterns 564 that cover the second mold mask patterns 544 and the second spacers 554 in the memory cell region 300A. In the connection region 300B, the local mask patterns 560 are formed in such a manner that one first local mask pattern 562 does not cover two or more first spacers 552, that is, one first local mask pattern 562 covers only one spacer 552. One or more first local mask patterns 562 may be formed on one first spacer 552. As depicted in FIGS. 4C and 5C, the second local mask patterns 564 may completely cover the second mold mask patterns 544 and the second spacers 554. Although not shown, in some embodiments, the second local mask pattern 564 may only cover the second mold mask pattern 544 or to cover the entire second mold mask pattern 544 and a portion of the second spacers 554. The local mask pattern 560 may be, for example, a photoresist pattern.

Figure 4D:
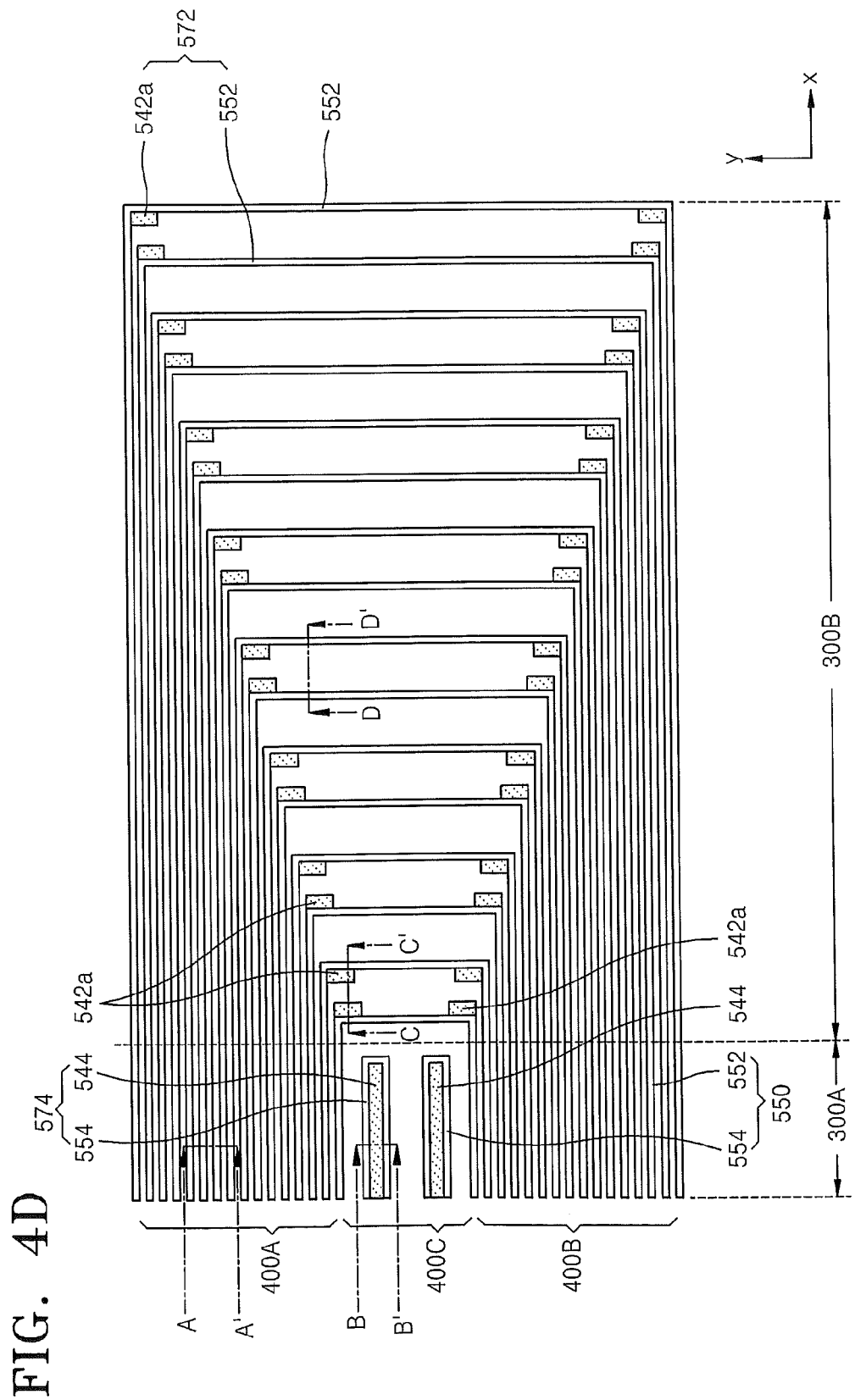
Figure 5D:
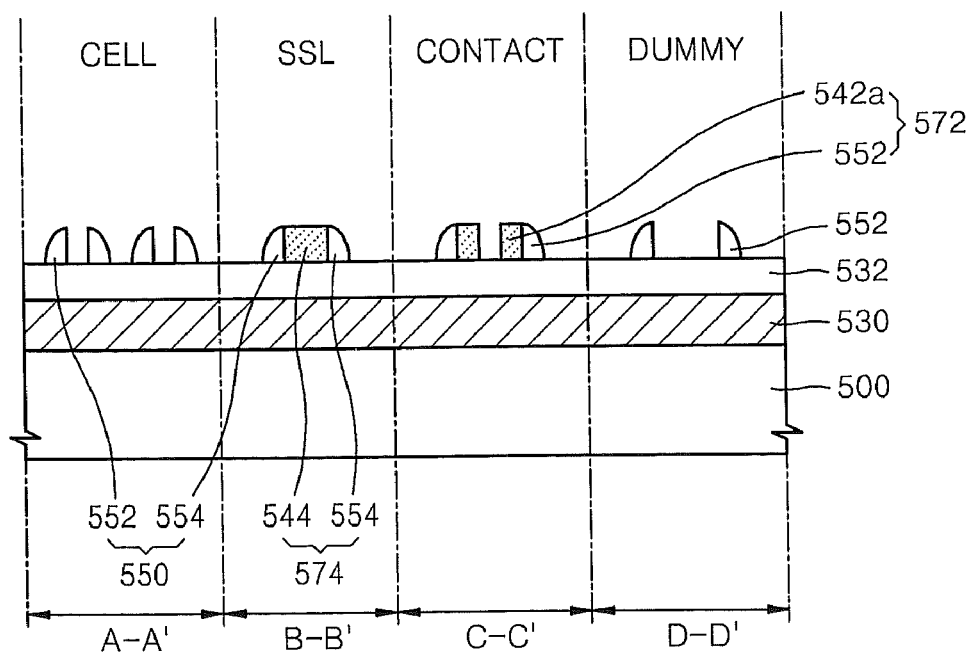

Referring to FIGS. 4D and 5D, only the first local regions of the first mold mask patterns 542 remain after the mold mask patterns 540 are etched using the spacers 550 and the local mask pattern 560 as etch masks. More specifically, the first mold mask patterns 542 are etched using the first spacers 552, the first local mask patterns 562, and the second local mask patterns 564 as etch masks.

Afterwards, the local mask patterns 560 are removed. As a result, the first local regions 542a of the first mold mask patterns 542 that are covered by the first local mask patterns 562 remain.

The first local regions 542a and the first spacers 552 are parts of a plurality of first mask lines 572 that extend from the first memory cell block region 400A to the second memory cell block region 400B through the connection region 300B. In the memory cell region 300A, the second mold mask patterns 544 and the second spacers 554 formed between the first memory cell block region 400A and the second memory cell block region 400B form second mask lines 574.

Figure 4E:
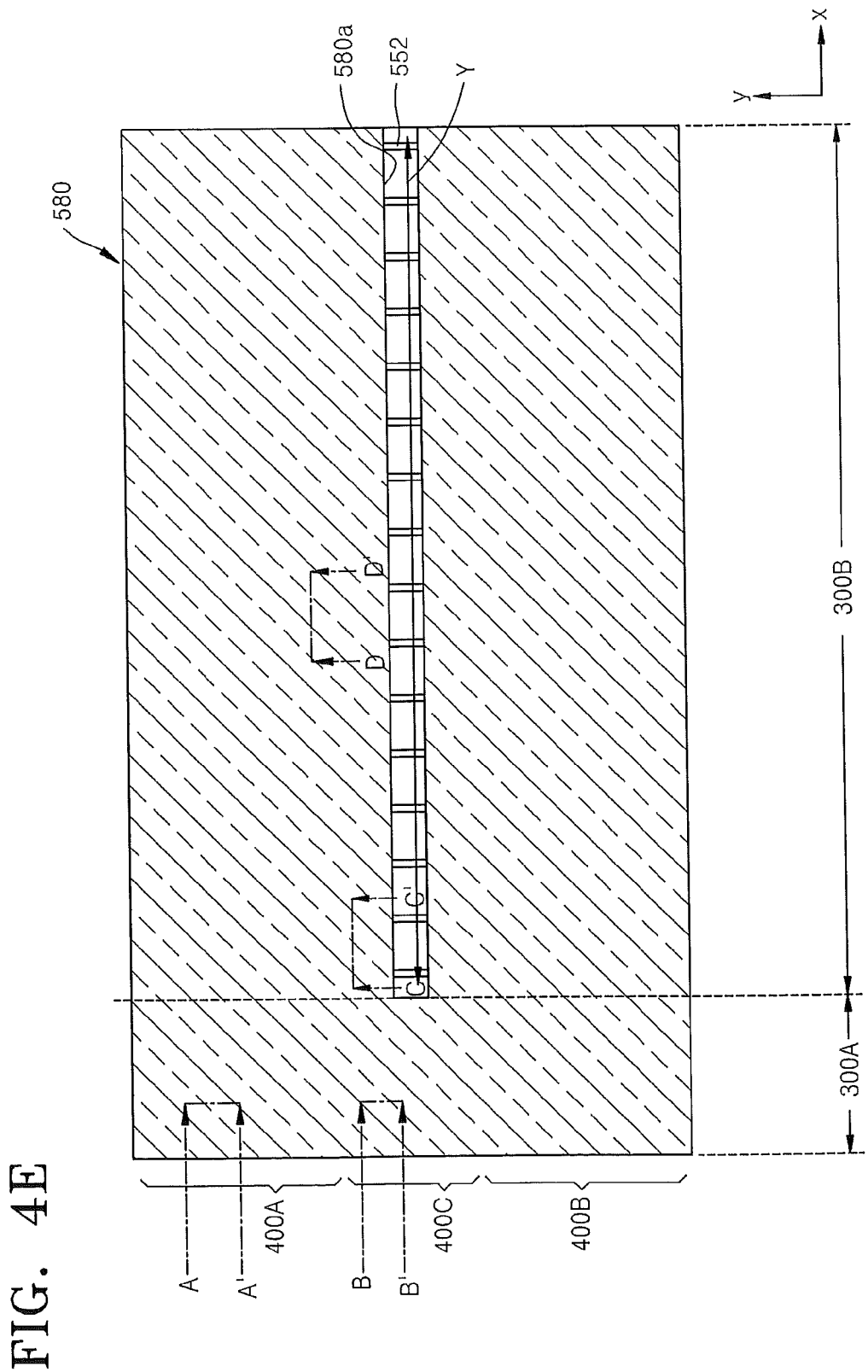
Figure 5E:
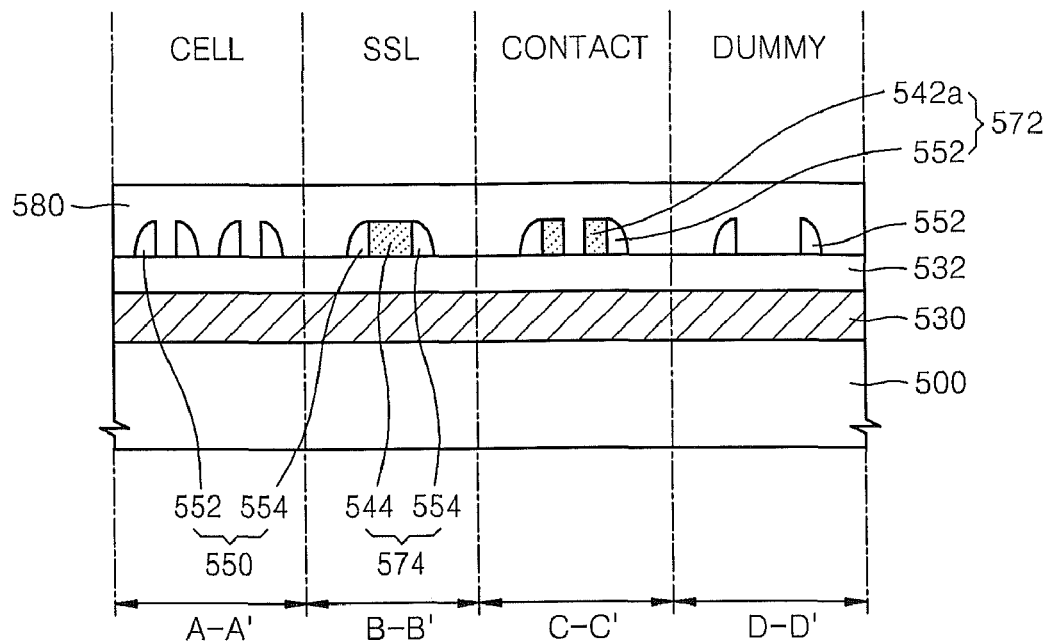

Referring to FIGS. 4E and 5E, a separation mask pattern 580 having an opening 580a that exposes a portion of the first mask lines 572 is formed on the first mask lines 572 and the second mask lines 574. In FIG. 4E, the first mask lines 572, that is, the first spacers 552 formed in the connection region 300B, are exposed through the opening 580a. The opening 580a may have a slit shape having a length axis Y in a direction different from a direction in which the first mask lines 572 extend (in FIG. 4E, a y direction). In FIG. 4E, the length axis Y of the opening 580a extends in a direction (in FIG. 4E, an x direction) perpendicular to the direction of the first mask lines 572 in the connection region 300B. However, the present invention is not limited thereto, and one of ordinary skill in the art may modify the shape and extension direction of the opening 580a in various ways without departing from the spirit and scope of the invention. The separation mask pattern 580 may be a photoresist pattern.

Figure 4F:
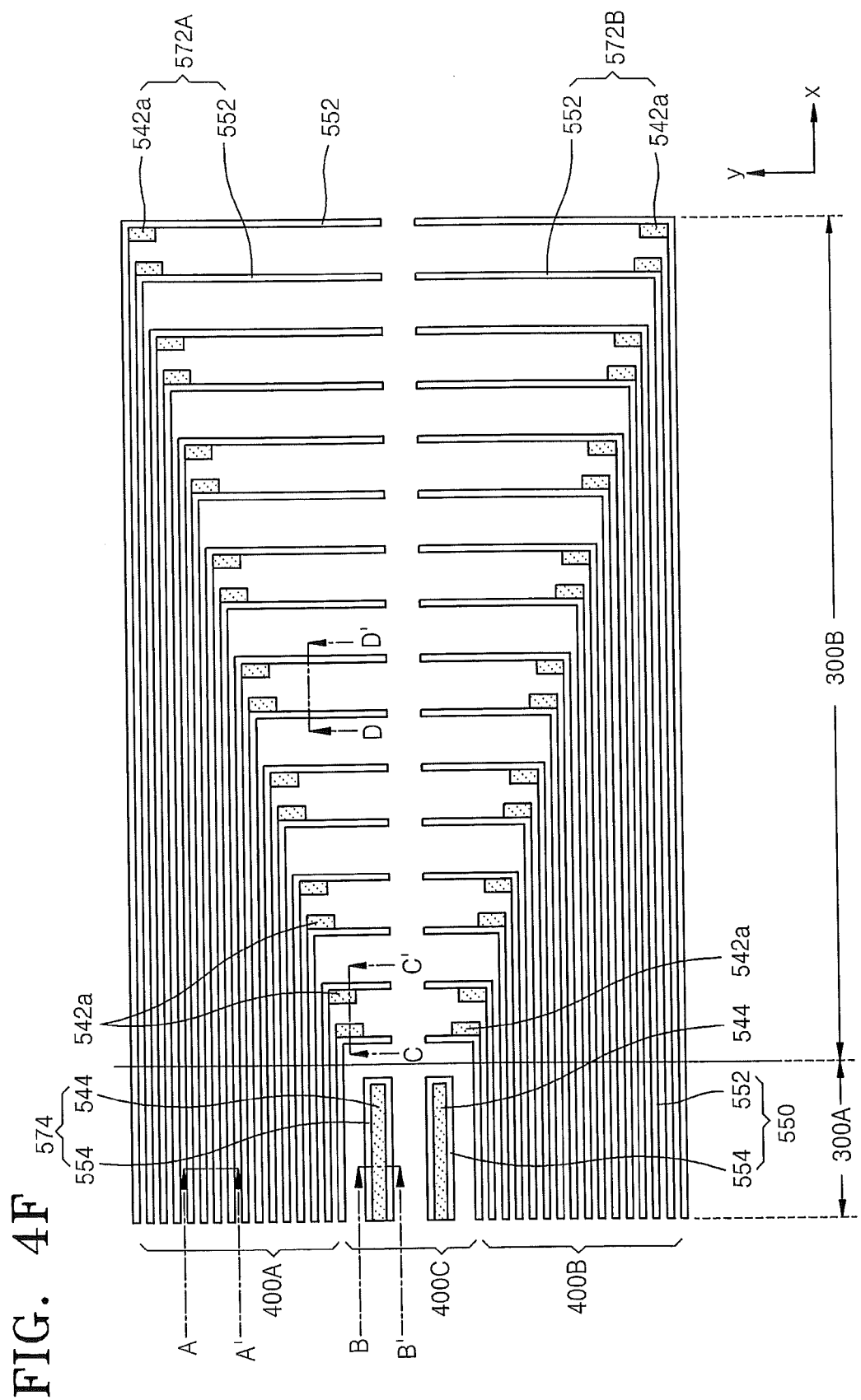
Figure 5F:
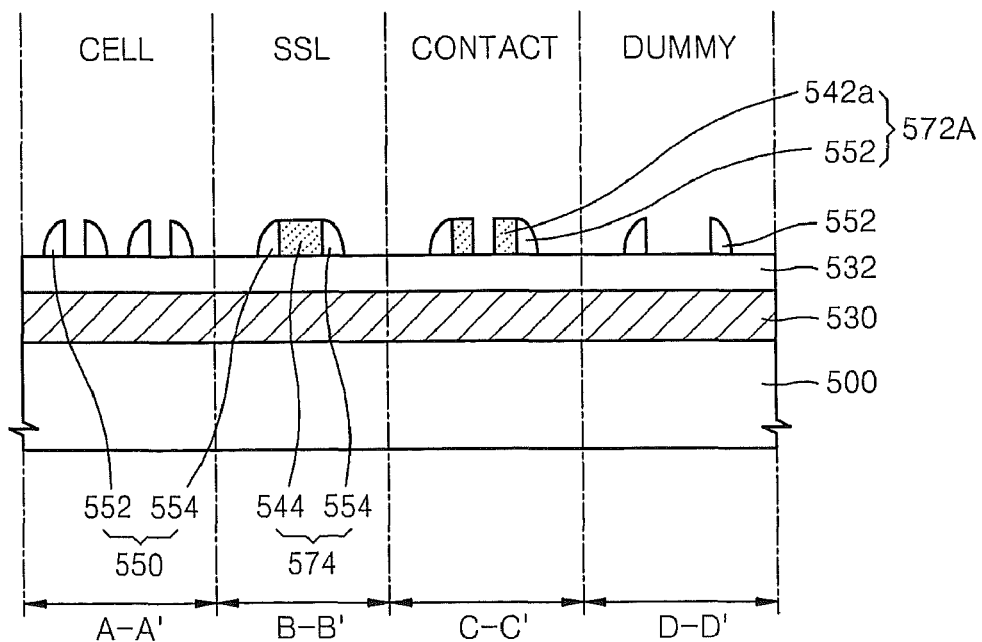

Referring to FIGS. 4F and 5F, the portions of the first mask lines 572 exposed through the opening 580a in the connection region 300B are removed using the separation mask pattern 580 as an etch mask. Afterwards, the separation mask pattern 580 is removed. As a result, the first mask lines 572 are separated into a plurality of first region mask patterns 572A extending from the connection region 300B to the first memory cell block region 400A and a plurality of second region mask patterns 572B extending from the connection region 300B to the second memory cell block region 400B.

Figure 5G:
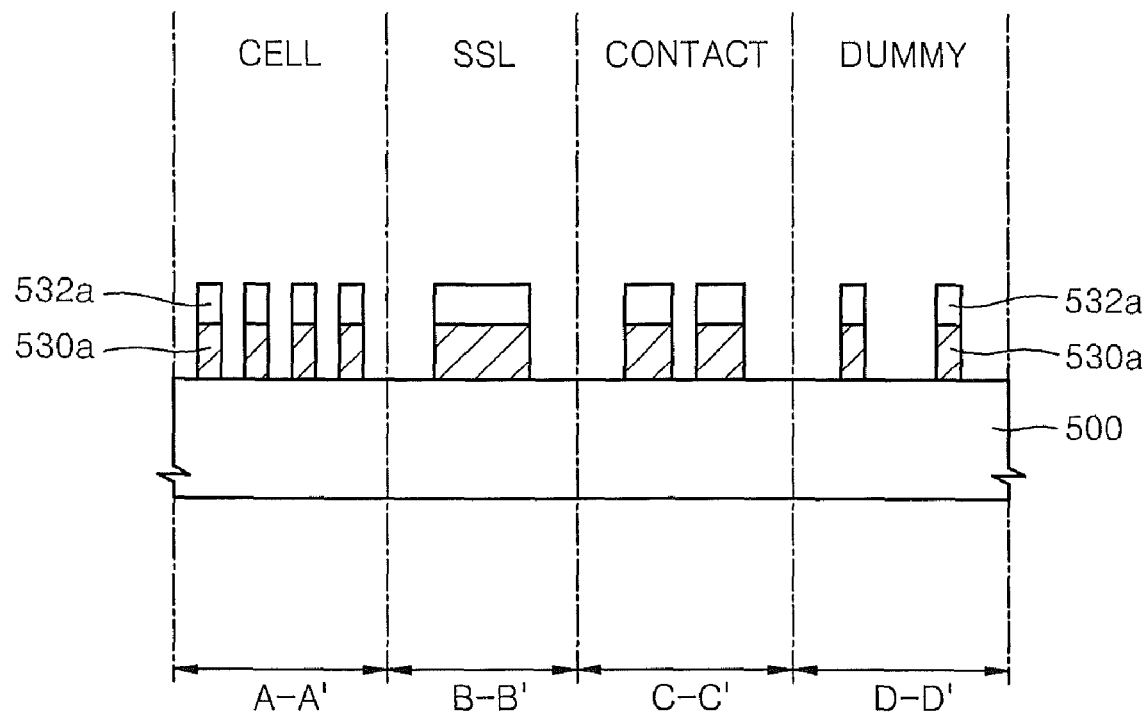

Referring to FIG. 5G, a capping layer pattern 532a and a conductive layer pattern 530a are formed by etching the capping layer 532 and the conductive layer 530 using the first region mask patterns 572A, the second region mask patterns 572B, and the second mask lines 574 as etch masks. The conductive layer patterns 530a include a plurality of first conductive lines 312 and second conductive lines 322 extending parallel to each other respectively in the first memory cell block region 400A and second memory cell block region 400B in the memory cell region 300A, a plurality of first contact pads 314 and second contact pads 324 respectively integrally formed with the first conductive lines 312 and the second conductive lines 322 in the connection region 300B, respectively, and a plurality of first conductive dummy lines 316 and second conductive dummy lines 326 respectively extending from the first contact pads 314 and the second contact pads 324 in the connection region 300B (refer to FIG. 3). The conductive layer patterns 530a may further include string selection lines SSL extending parallel to the first conductive lines 312 and the second conductive lines 322 in the first memory cell block region 400A and the second memory cell block region 400B in the memory cell region 300A.

A NAND flash memory device according to some embodiments of the present invention includes: a plurality of conductive lines extending parallel to each other in a first direction in a memory cell region in order to form a memory cell; and a plurality of contact pads respectively integrally formed with the conductive lines in a connection region in order to connect the conductive lines to an external circuit such as a decoder. In the connection region, conductive dummy lines extend in a second direction, which is different from the first direction in the first contact pads. The conductive dummy lines, having lengths different from each other, extend in the connection region. Thus, a pattern density of the connection region, which has a pattern density lower than the memory cell region, is increased due to the conductive dummy lines. Thus, a problem whereby a dishing phenomenon that can occur in a low density pattern region as a result of chemical mechanical polishing (CMP) during performance of a planarizing process of an interlayer insulating film or a defocus phenomenon that can occur due to a step difference in a photolithographic process can be reduced or prevented.

In operations for manufacturing a NAND flash memory device according to some embodiments of the present invention, when integrally forming conductive lines for a memory cell region and contact pads for connecting the conductive lines to peripheral circuits, such as decoders, a layout of a mask pattern for trimming can be simplified. A permissible range of alignment error between the trimming mask pattern and conductive lines, such as word lines or bit lines, may be increased, and the trimming process can be effectively performed by using a relatively simple process. In particular, in operations for manufacturing a NAND flash memory device according some embodiments of the present invention, in simultaneously forming an X-decoder located on an end portion of a word line that constitutes a cell string together with the word line, after forming a plurality of mold mask patterns for forming etch mask patterns required for etching the conductive lines and spacers on sidewalls of the mold mask patterns, the word line is formed by etching the conductive lines by using the spacers as etch masks. Thus, in forming minute mask patterns for etching the conductive lines, a critical dimension can be substantially uniformly maintained. Accordingly, gate channels can have a substantially uniform length, which may be advantageous for uniformly controlling a threshold voltage in the memory cells.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. The invention is defined by the following claims.

What is claimed is:

1. A NAND flash memory device comprising:
a first conductive line and a second conductive line disposed on a substrate, the first and second conductive lines extending in parallel along a first direction;
a first contact pad disposed at an end of the first conductive line;
a second contact pad disposed at an end of the second conductive line;
a first dummy line extending from the first contact pad in a second direction; and
a second dummy line extending from the second contact pad in the second direction,
wherein the first direction and the second direction are substantially perpendicular with respect to each other.

2. The NAND flash memory device of claim 1, wherein the first dummy line and the second dummy line extend in parallel.

3. The NAND flash memory device of claim 1, wherein the first and second conductive lines and the first and second dummy lines define right angles, and wherein the first and second contact pads comprise rectangular regions that alternately protrude inside and outside of the right angles along the first direction.

4. The NAND flash memory device of claim 1, wherein the first and second dummy contact pads protrude toward one another along.

5. The NAND flash memory device of claim 1, wherein the first conductive line and second conductive line have differing lengths.

6. The NAND flash memory device of claim 1, wherein the first dummy line and second dummy line have differing lengths.

7. The NAND flash memory device of claim 1, wherein the first and second conductive lines are word lines.

8. The NAND flash memory device of claim 1, wherein the first and second conductive lines are bit lines.

9. The NAND flash memory device of claim 1, wherein the first and second conductive lines, the first and second contact pads, and the first and second dummy lines are formed of the same material.

10. The NAND flash memory device of claim 1, wherein the first and second conductive lines, the first and second contact pads, and the first and second dummy lines comprise at least one common material layer.

11. The NAND flash memory device of claim 1, herein the first and second conductive lines are disposed on a common level of the substrate.

12. The NAND flash memory device of claim 1, wherein the first and second conductive lines comprise word lines, each comprising a tunneling oxide film, a charge storage layer, a blocking oxide film, and a gate electrode layer.

13. A semiconductor memory device comprising:
a first conductive line and a second conductive line disposed on a semiconductor substrate;
a first contact pad disposed at an end of the first conductive line;
a second contact pad disposed at an end of the second conductive line;
a first dummy line extending from the first contact pad in a first direction; and
a second dummy line extending from the second contact pad in the first direction.

14. The semiconductor memory device of claim 13, wherein the first conductive line and the second conductive line have differing lengths.

15. The semiconductor memory device of claim 13, wherein the first and second conductive lines extend in second direction.

16. The semiconductor memory device of claim 14, wherein the first direction and the second direction is substantially perpendicular with respect to each other.

17. The semiconductor memory device of claim 13, further comprising a third conductive line and a fourth conductive line disposed adjacent the first and second conductive lines on the semiconductor substrate, a third contact pad disposed at an end of the third conductive line, a fourth contact pad disposed at an end of the fourth conductive line, a third dummy line extending from the third contact pad in the first direction, and a fourth dummy line extending from the fourth contact pad in the first direction.

18. The semiconductor memory device of claim 17, wherein a group of the third and fourth conductive lines, the third and fourth contact pads, and the third and fourth dummy line is mirror image of a group of the first and second conductive lines, the first and second contact pads, and the first and second dummy lines about an axis of symmetry therebetween.

19. The semiconductor memory device of claim 18, wherein the first, second, third and fourth conductive lines are word lines.

20. The semiconductor memory device of claim 19, further comprising string selection lines extending parallel to the first, second, third and fourth conductive lines between a group of the first and second conductive lines and a group of the third and fourth conductive lines.

* * * * *